United States Patent
Kang et al.

(10) Patent No.: US 9,622,309 B2
(45) Date of Patent: Apr. 11, 2017

(54) LIGHT EMITTING MODULE

(71) Applicant: LG INNOTEK CO., LTD., Seoul (KR)

(72) Inventors: Il Yeong Kang, Seoul (KR); Ki Soo Kwon, Seoul (KR); Sang Hoon Lee, Seoul (KR); Keun Tak Joo, Seoul (KR); Tae Young Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/015,440

(22) Filed: Feb. 4, 2016

(65) Prior Publication Data

US 2016/0183336 A1 Jun. 23, 2016

Related U.S. Application Data

(63) Continuation of application No. 14/171,232, filed on Feb. 3, 2014, now Pat. No. 9,307,596.

(30) Foreign Application Priority Data

Feb. 5, 2013 (KR) .................. 10-2013-0012773

(51) Int. Cl.
H05B 33/08 (2006.01)
(52) U.S. Cl.
CPC .. H05B 33/083 (2013.01); *H01L 2224/45139* (2013.01); *H01L 2224/48091* (2013.01); *H01L 2224/49107* (2013.01)
(58) Field of Classification Search
CPC ............. H05B 33/083; H05B 33/0803; H05B 33/0842; H05B 33/0815; H05B 33/0896; H05B 37/029; H01L 33/62; H01L 2224/48091; H01L 2224/45139; H01L 2224/49107; H01L 2924/00014; H01L 2924/00
USPC ... 315/185 R, 294, 297, 312, 192, 307, 318; 257/88, 98, 103, E33.066, E33.001, 257/E33.068
See application file for complete search history.

(56) References Cited

U.S. PATENT DOCUMENTS 7,723,736 B2 5/2010 Lee et al.
8,115,412 B2 2/2012 Urakabe et al.
(Continued)

FOREIGN PATENT DOCUMENTS

CN 102005448 4/2011
CN 102005465 4/2011
(Continued)

OTHER PUBLICATIONS

U.S. Office Action issued in parent U.S. Appl. No. 14/171,232 dated Apr. 27, 2015,.
(Continued)

*Primary Examiner* — Haissa Philogene
(74) *Attorney, Agent, or Firm* — KED & Associates, LLP

(57) ABSTRACT

A light emitting module includes a plurality of light emitting device packages configured to be sequentially turned on or off according to the level of external drive voltage and connected to one another in series. Each of the plurality of light emitting device packages includes a light emitting cell having at least one light emitting device, and an on/off controller configured to control to turn the light emitting cell on or off.

16 Claims, 14 Drawing Sheets

(56) References Cited

U.S. PATENT DOCUMENTS

| | | | |
|---|---|---|---|
| 8,120,287 B2* | 2/2012 | Lin | H05B 33/0827 |
| | | | 315/169.1 |
| 8,264,169 B2 | 9/2012 | Shteynberg et al. | |
| 9,070,613 B2* | 6/2015 | Hwang | H01L 27/15 |
| 9,209,363 B2* | 12/2015 | Oh | H01L 33/28 |
| 9,307,596 B2* | 4/2016 | Kang | H05B 33/083 |
| 2007/0145914 A1 | 6/2007 | Hong et al. | |
| 2007/0257623 A1 | 11/2007 | Johnson et al. | |
| 2009/0230883 A1 | 9/2009 | Haug | |
| 2011/0049537 A1 | 3/2011 | Lee et al. | |
| 2011/0187276 A1 | 8/2011 | Shteynberg et al. | |

FOREIGN PATENT DOCUMENTS

| | | |
|---|---|---|
| EP | 2 728 970 A2 | 5/2014 |
| EP | 2 753 149 A1 | 7/2014 |
| EP | 2 911 479 A2 | 8/2015 |

OTHER PUBLICATIONS

European Search Report issued in Application No. 14153051.9 dated Jan. 20, 2016.
Chinese Office Action dated Oct. 28, 2016 issued in Application No. 201410043484.8 (with English Translation).

* cited by examiner

LIGHT EMITTING MODULE

CROSS REFERENCE TO RELATED APPLICATION

This application is a Continuation Application of prior U.S. patent application Ser. No. Continuation of Ser. No. 14/171,232 filed on Feb. 3, 2014, which claims priority under 35 U.S.C. §119 to Korean Application No. 10-2013-0012773 filed on Feb. 5, 2013, whose entire disclosures are hereby incorporated by reference.

BACKGROUND

1. Field

Embodiments relate to light emitting modules.

2. Background

Light Emitting Diodes (LEDs) are semiconductor devices that transmit and receive signals by converting electrical energy into visible or infrared light using properties of compound semiconductors, or that are used as a light source.

Group III-V nitride semiconductors are receiving attention as a core material of light emitting devices, such as Light Emitting Diodes (LEDs) or Laser Diodes (LDs), owing to physical and chemical properties thereof.

These light emitting diodes exhibit excellent environmental friendliness because they do not contain environmentally harmful substances, such as Mercury (Hg) used in conventional lighting including fluorescent lamps, incandescent lamps, etc., and have advantages of low power consumption and semi-permanent lifespan, etc. Therefore, conventional light sources are being replaced by light emitting diodes.

In general, a light emitting module includes light emitting device packages, and in turn each light emitting device package includes light emitting devices, such as LEDs. The light emitting devices are driven by a drive Integrated Circuit (IC). In this case, the light emitting devices are arranged inside the light emitting device package, whereas the drive IC is arranged outside the light emitting device package. As the drive IC is arranged outside the light emitting device package rather than inside the package, there is a need for a space for installation of the drive IC, which limits diversity in the design of the light emitting module.

In addition, a conventional high-voltage light emitting module includes a plurality of light emitting devices connected to one another in series, switching devices to turn the respective light emitting devices on or off, and a single drive IC to control switching of the switching devices. In this case, the drive IC controls switching of the switching devices based on the level of Alternating Current (AC) drive voltage applied from an external source to turn the plurality of light emitting devices on or off in sequence. When the single drive IC controls driving of all of the light emitting devices as described above, the drive IC must be designed to withstand a maximum of 600 volts. This high withstand voltage of the drive IC increases manufacturing costs.

In addition, such a conventional light emitting module includes Zener diodes as well as light emitting devices, in order to prevent electrostatic discharge of LEDs due to static electricity introduced from an external source. However, Zener diodes are expensive, and addition of processes of mounting Zener diodes increases the number of manufacturing processes of the light emitting module, thus increasing manufacturing costs.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
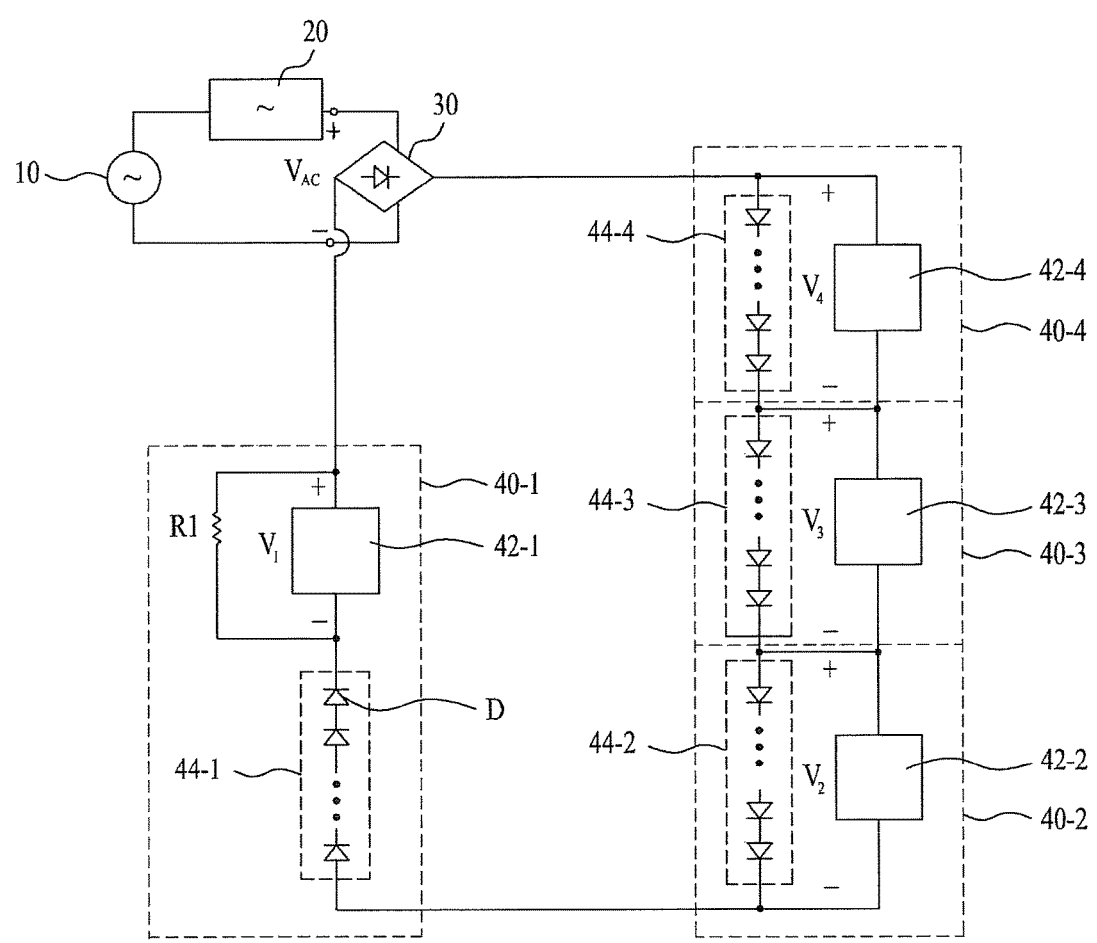
FIG. 1 is a circuit diagram of a light emitting module according to one embodiment.

Hereinafter, embodiments will be described in detail with reference to the annexed drawings for better understanding. However, it will be apparent that the embodiments may be modified in various ways and the scope of the embodiments should not be construed as being limited to the following description. Thus, the embodiments are provided to ensure more perfect comprehension of the embodiments by one of ordinary skill in the art.

In the following description of the embodiments, it will be understood that, when each element is referred to as being formed "on" or "under" the other element, one element can be directly "on" or "under" the other element or the two elements can be indirectly formed with intervening one or more other elements therebetween. Also, it will also be understood that "on" or "under" one element may contain the meaning of upward or downward on the basis of the element.

In the drawings, the thickness or size of each layer may be exaggerated, omitted, or schematically illustrated for clarity and convenience. In addition, the size of each constituent element does not wholly reflect an actual size thereof.

FIG. 1 is a circuit diagram of a light emitting module according to one embodiment.

The light emitting module, exemplarily shown in FIG. 1, includes an Alternating Current (AC) power source 10, a fuse 20, a rectifier 30, and first to Mth light emitting device packages 40-1 to 40-M. Here, M is a positive integer of 2 or more. For convenience, although the following description assumes M=4, the embodiment will be applied even when M is greater or less than 4.

The AC power source 10 supplies external AC drive voltage VAC. In this case, the external drive voltage may have a root-mean-square value of 100V or 200V and a frequency of 50 Hz to 60 Hz.

The fuse 20 serves to protect the light emitting module of FIG. 1 from surges in external drive voltage. That is, the fuse 20 is open when receiving surges in external drive voltage to protect the light emitting module. To this end, the fuse 20 may be disposed between the AC power source 10 and the rectifier 30.

The rectifier 30 may be implemented by a full-wave diode bridge circuit which rectifies external AC drive voltage VAC supplied from the AC power source 10 to convert the same into a ripple signal. The full-wave diode bridge circuit may include four bridge diodes BD1, BD2, BD3, BD4. The full-wave diode bridge circuit is generally known, and thus a detailed description thereof will be omitted herein.

In this case, the light emitting module may further include a smoother (not shown) which smoothes external drive voltage rectified by the rectifier 30 to convert the same into a Direct Current (DC) signal and output the converted DC signal. The smoother may be disposed between the rectifier 30 and the first to Mth light emitting device packages 40-1 to 40-M.

For convenience, although the light emitting module has been described hereinafter as not including the smoother and as supplying external drive voltage rectified by the rectifier 30 to the plurality of light emitting device packages 40-1 to 40-M, the embodiment is not limited thereto.

The plurality of light emitting device packages 40-1 to 40-M is sequentially turned on or is sequentially turned off based on the level of the rectified external drive voltage, and are connected to one another in series. The plural light emitting device packages 40-1 to 40-M respectively include on/off controllers 42-1 to 42-M and light emitting cells 44-1 to 44-M. That is, a first light emitting device package 40-1 includes a first on/off controller 42-1 and a first light emitting cell 44-1, a second light emitting device package 40-2 includes a second on/off controller 42-2 and a second light emitting cell 44-2, a third light emitting device package 40-3 includes a third on/off controller 42-3 and a third light emitting cell 44-3, and a fourth light emitting device package 40-4 includes a fourth on/off controller 42-4 and a fourth light emitting cell 44-4.

In each 44-*m* of the light emitting device packages 40-1 to 40-M, an mth light emitting cell 44-*m* includes at least one light emitting device D. Here, 1≤m≤M. Although FIG. 1 shows the mth light emitting cell 44-*m* as including a plurality of light emitting devices D, the embodiment is not limited thereto. That is, the mth light emitting cell 44-*m* may include only one light emitting device D. The light emitting device D, for example, may be a Light Emitting Diode (LED). The LED may include a colored LED configured to emit red, green, blue, or white light, and an ultraviolet (UV) LED configured to emit UV light.

In each 40-*m* of the light emitting device packages 40-1 to 40-M, an mth on/off controller 42-*m* controls to turn the mth light emitting cell 44-*m* on or off. The mth on/off controller 42-*m* may include a current control Integrated Circuit (IC) to control flow of current to the mth light emitting cell 44-*m*.

In at least one light emitting device package among the plurality of light emitting device packages 40-1 to 40-M, the light emitting cell and the on/off controller may be connected to each other in parallel. That is, in the second to fourth light emitting device packages 40-2 to 40-4 of the light emitting module exemplarily shown in FIG. 1, the second to fourth light emitting cells 44-2 to 44-4 are respectively connected to the second to fourth on/off controllers 42-2 to 42-4 in parallel.

In the other light emitting device package among the plurality of light emitting device packages 40-1 to 40-M, the light emitting cell and the on/off controller may be connected to each other in series. That is, in the first light emitting device package 40-1 of the light emitting module exemplarily shown in FIG. 1, the first light emitting cell 44-1 is connected to the first on/off controller 42-1 in series.

In addition, any one light emitting device package among the plurality of light emitting device packages 40-1 to 40-M may further include a current limit resistor connected to the on/off controller in parallel. That is, the first light emitting device package 40-1 exemplarily shown in FIG. 1 may further include a current limit resistor R1 connected to the first on/off controller 42-1 in parallel.

FIG. 1 simply exemplifies the light emitting module according to one embodiment, and the embodiment is not limited to the shown configuration. That is, the light emitting module according to the embodiment may be implemented into any shape so long as it includes a plurality of light emitting device packages and each light emitting device package includes a single light emitting cell and an on/off controller to turn the light emitting cell on or off.

Hereinafter, operation of the light emitting module having the above described configuration as exemplarily shown in FIG. 1 will be described with reference to the accompanying drawings. However, it will be appreciated that operation of the light emitting module, i.e. operation of the on/off controller that will be described hereinafter is simply one example and the light emitting device(s) of the light emitting cell may be operated in various other ways.

Figure 2A:
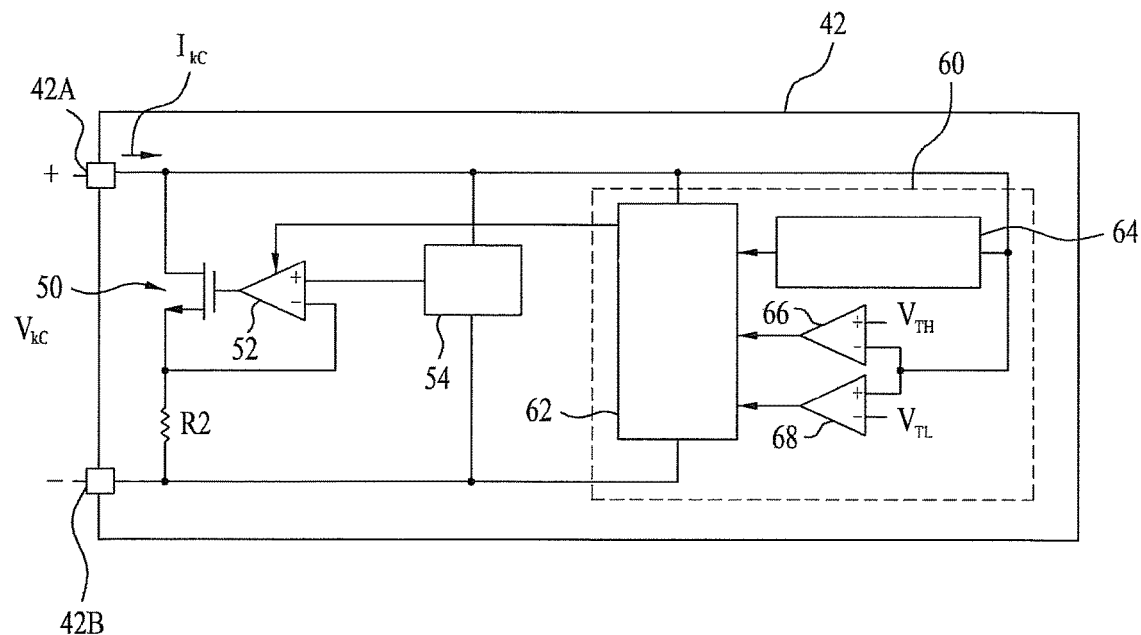
FIG. 2A is a circuit diagram of a kth on/off controller shown in FIG. 1 according to one embodiment.
Figure 2B:
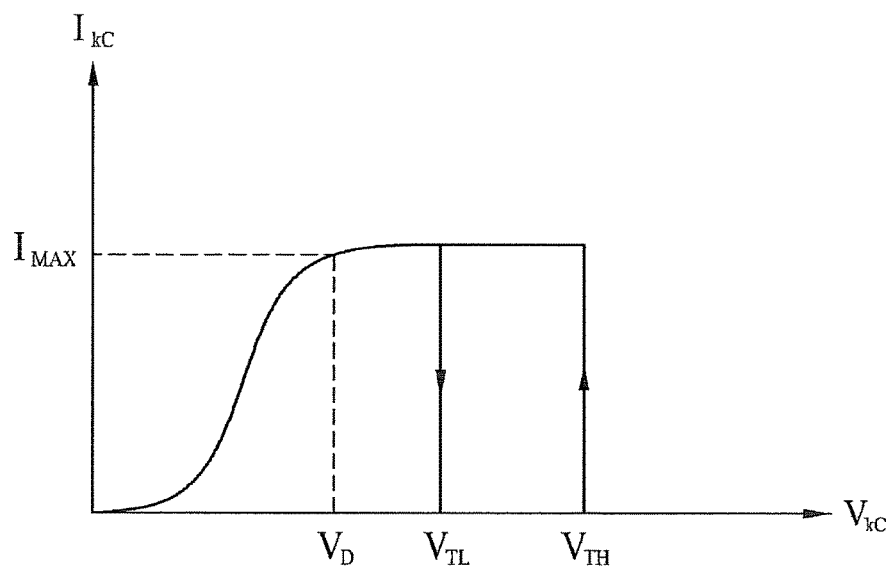
FIG. 2B is a graph showing characteristics of voltage applied to both ends of the kth on/off controller and current flowing to the kth on/off controller shown in FIG. 2A.

FIG. 2A is a circuit diagram of a kth on/off controller 42-*k* shown in FIG. 1 according to one embodiment, and FIG. 2B is a graph showing characteristics of voltage VkC at both ends of the kth on/off controller 42-*k* and current IkC flowing to the kth on/off controller 42-*k* shown in FIG. 2A. Here, 2≤k≤M.

The kth on/off controller 42-*k*, exemplarily shown in FIG. 2A, includes a resistor R2, a switching device 50, a comparator 52, a reference voltage generator 54, and a drive signal generator 60.

The switching device 50 implements a switching operation of being turned on or off in response to an output of the comparator 52. For example, although the switching device 50 may take the form of a Field Effect Transistor (FET) as exemplarily shown in FIG. 2A, the switching device 50 is not limited thereto, and may take the form of a bipolar junction transistor.

The comparator 52 compares a voltage between a source of the FET 50 and the resistor R2 with a reference voltage each other, and applies the comparative result to a gate of the FET 50. The resistor R2 is connected between the source of the FET 50 and a second terminal 42B.

The reference voltage generator 54 generates a reference voltage using voltage between a first terminal 42A and the second terminal 42B. Here, assuming that light emitting devices included in the kth light emitting cell 44-*k* are first to Nth light emitting diodes connected to one another in series, the first terminal 42A is connected to an anode of the first light emitting diode and the second terminal 42B is connected to a cathode of the Nth light emitting diode. Here, N is a positive integer of 1 or more.

The drive signal generator 60 includes a logic unit 62, a level detector 64, and comparators 66, 68. The level detector 64 detects the lowered level or raised level of voltage VkC at the first terminal 42A, and outputs the detected result to the logic unit 62. The comparator 66 compares a first critical voltage VTH with the voltage VkC, and outputs the comparative result to the logic unit 62. The comparator 68 compares a second critical voltage VTL with the voltage VkC, and outputs the comparative result to the logic unit 62. The first and second critical voltages VTH, VTL are the most approximate to forward voltage of the light emitting device D.

The logic unit 62 logically combines the output of the level detector 64 with the output of the comparator 66 or 68, and outputs the logically combined result as a signal to drive the comparator 52.

The kth on/off controller 42-$k$ having the above described configuration is operated as follows.

Referring to FIG. 2B, the kth on/off controller 42-$k$ controls flow of current through the kth light emitting cell 44-$k$ based on voltage Vk at both ends of the kth light emitting cell 44-$k$. A k−1st light emitting cell 44-$(k-1)$ and the kth light emitting cell 44-$k$ are connected to each other in series, and the kth on/off controller 42-$k$ is connected to the kth light emitting cell 44-$k$ in parallel.

First, while the level of external drive voltage rectified by the rectifier 30 is raised, if current IkC begins to flow to the kth on/off controller 42-$k$ when voltage VkC at both ends of the kth on/off controller 42-$k$ exceeds a startup voltage, no current IkL flows to the kth light emitting cell 44-$k$ (that is, IkL=0). As the current IkC flowing to the kth on/off controller 42-$k$ increases, the kth on/off controller 42-$k$ is operated as a voltage-controlled current source. In this case, current from the AC power source 10 flows through the kth on/off controller 42-$k$ and the k−1st light emitting cell 44-$(k-1)$.

When the voltage VkC at both ends of the kth on/off controller 42-$k$ becomes greater than a dropout voltage VD and less than the second critical voltage VTL, the current IkC flowing to the kth on/off controller 42-$k$ is adjusted to a prescribed magnitude of current IMAX. At this time, current IkL flowing to the kth light emitting cell 44-$k$ remains 'zero'.

When the voltage VkC at both ends of the kth on/off controller 42-$k$ exceeds the second critical voltage VTL, the kth on/off controller 42-$k$ is turned off. At this time, current from the AC power source 10 flows through the kth light emitting cell 44-$k$ and the k−1st light emitting cell 44-$(k-1)$.

Next, while the level of external drive voltage rectified by the rectifier 30 is lowered, the kth on/off controller 42-$k$ remains off when the voltage VkC at both ends of the kth on/off controller 42-$k$ exceeds the first critical voltage VTH. At this time, current from the AC power source 10 flows through the kth light emitting cell 44-$k$ and the k−1st light emitting cell 44-$(k-1)$.

When the voltage VkC at both ends of the kth on/off controller 42-$k$ becomes less than the first critical voltage VTH and greater than the dropout voltage VD, the kth on/off controller 42-$k$ is turned on such that no current IkL flows to the kth light emitting cell 44-$k$ after the current IkL adjusted to a prescribed magnitude of current IMAX begins to flow to the kth light emitting cell 44-$k$. That is, the current flowing to the kth light emitting cell 44-$k$ is bypassed to the kth on/off controller 42-$k$, and thus current from the AC power source 10 flows through the kth on/off controller 42-$k$ and the k−1st light emitting cell 44-$(k-1)$.

When the voltage VkC at both ends of the kth on/off controller 42-$k$ becomes less than the dropout voltage VD, the current IkC is adjusted based on the level of the voltage VkC and no current IkL flows to the kth light emitting cell 44-$k$.

The overall operation of the light emitting module exemplarily shown in FIG. 1 will be described hereinafter based on the above described operation of the kth on/off controller 42-$k$.

Figure 3:
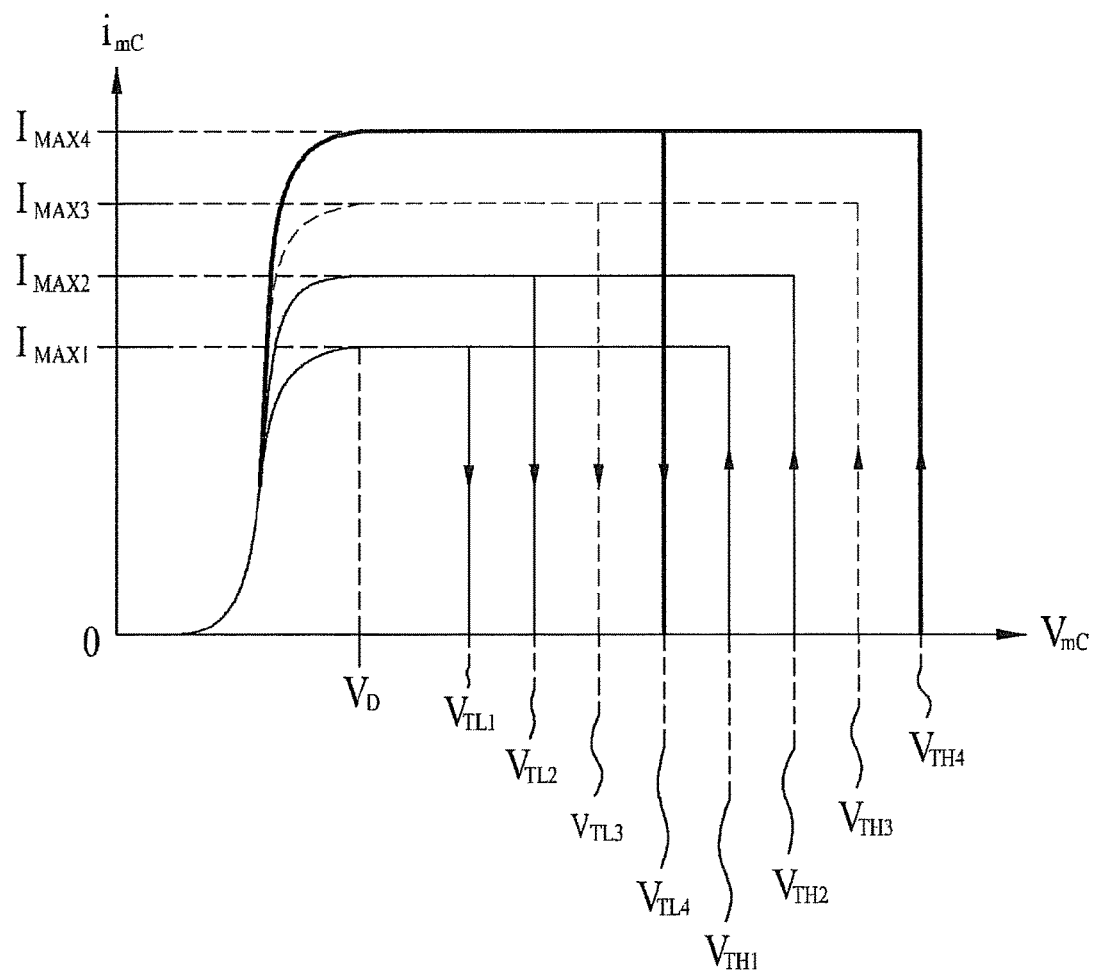
FIG. 3 is a graph showing characteristics of voltage and current of first to fourth on/off controllers.
Figure 4:
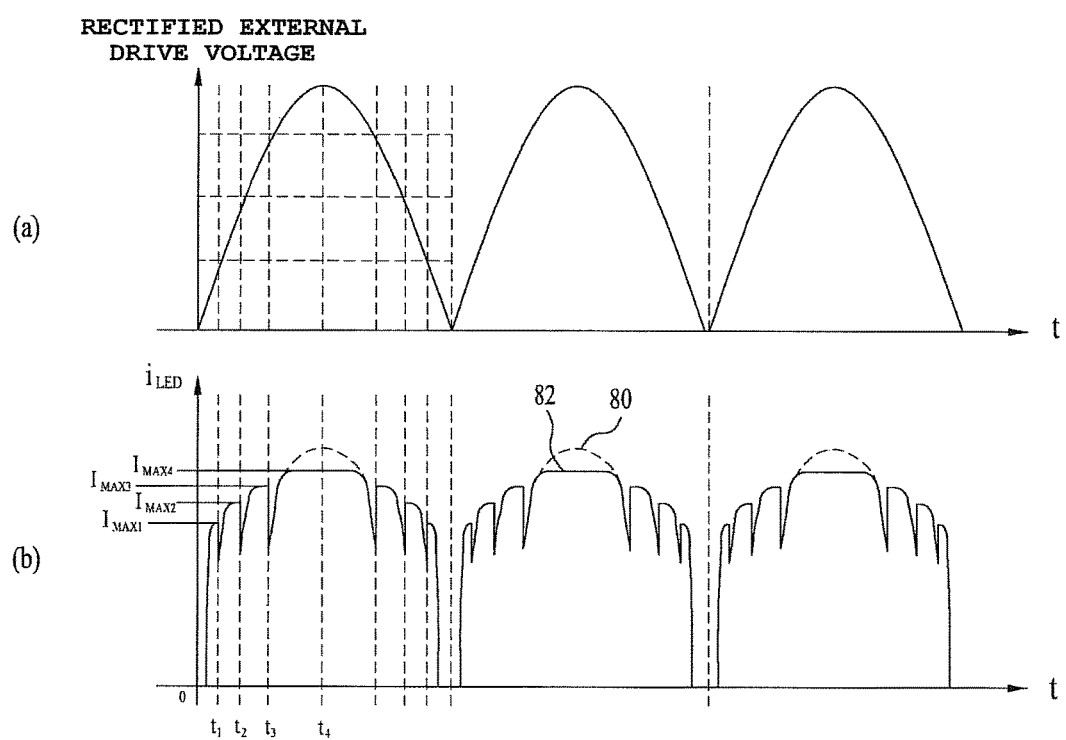
FIG. 4 is a graph showing voltage rectified by a rectifier as shown in (a), and a graph showing current flowing to the light emitting module as shown in (b)

FIG. 3 is a graph showing characteristics of voltage VmC and current imC of first to fourth on/off controllers 42-1 to 42-4. FIG. 4($a$) is a graph showing external drive voltage rectified by the rectifier 30, and FIG. 4($b$) is a graph showing current iLED flowing to the light emitting module.

As exemplarily shown in FIGS. 3 and 4($b$), respective light emitting cells 44-1 to 44-4 have different prescribed magnitudes of current IMAX1, IMAX2, IMAX3, IMAX4, different first critical voltages VTH1, VTH2, VTH3, VTH4, and different second critical voltages VTL1, VTL2, VTL3, VTL4.

In addition, while the level of the rectified external drive voltage is raised, the first on/off controller 42-1, to which the smallest magnitude of current IMAX1 among the prescribed magnitudes of current IMAX1, IMAX2, IMAX3, IMAX4 flows, begins to be turned on, and is first turned off. In addition, while the level of the rectified external drive voltage is lowered, the fourth on/off controller 42-4 having the greatest first critical voltage VTH4 among the first critical voltages VTH1, VTH2, VTH3, VTH4 is first turned on.

FIGS. 5A to 5D show sequential turn-on of the first to fourth light emitting cells 44-1 to 44-4. Here, current iLED flowing to the light emitting module is represented by arrows, and the light emitting device D is turned on if it is included in the light emitting cell located on a flow path of the current iLED and otherwise, is turned off.

Figure 5A:
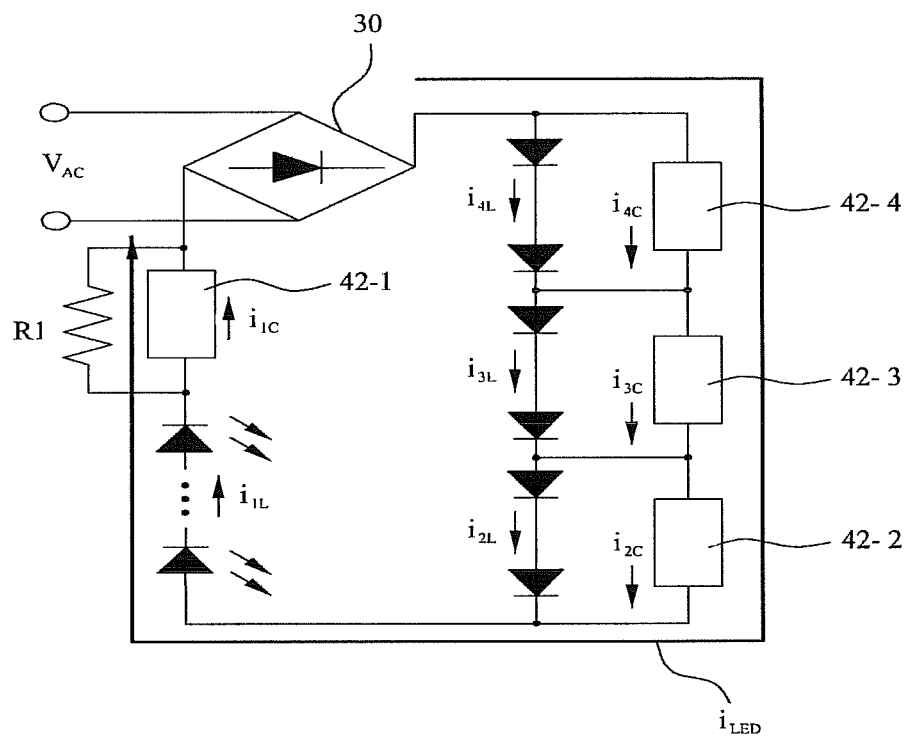
FIGS. 5A to 5D show sequential turn-on of first to fourth light emitting cells.

That is, under the condition of 0≤t≤t1, as exemplarily shown in FIG. 5A, the first light emitting cell 44-1 is turned on and the second to fourth light emitting cells 44-2 to 44-4 are turned off. In this case, current from the AC power source 10 does not flow through the second to fourth light emitting cells 44-2 to 44-4, but flows through the first to fourth on/off controller 42-1 to 42-4 and the first light emitting cell 44-1.

Figure 5B:
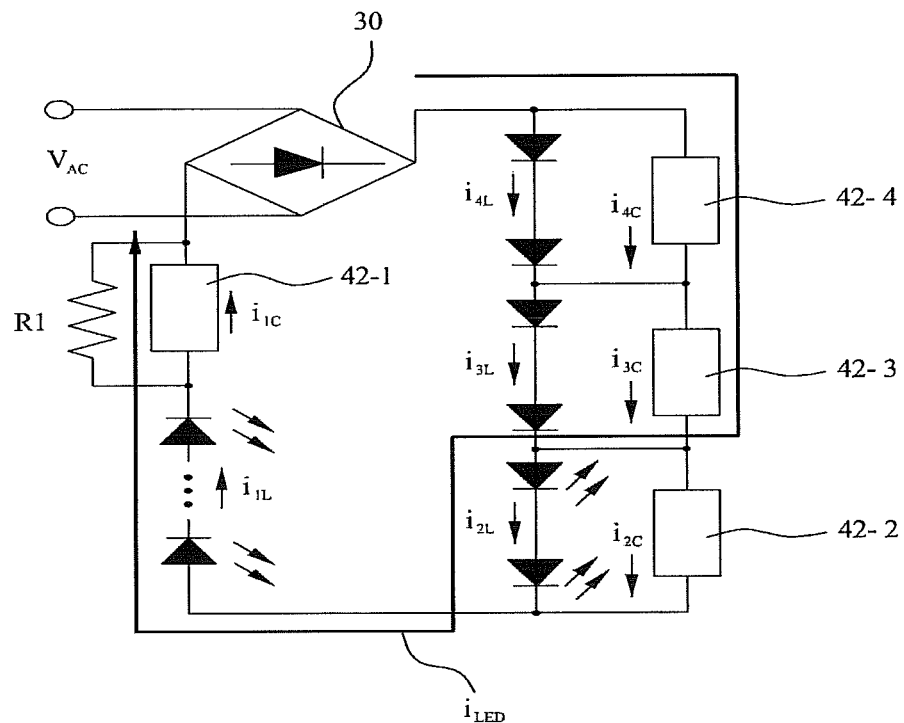

Thereafter, under the condition of t1≤t≤t2, as exemplarily shown in FIG. 5B, the first and second light emitting cells 44-1, 44-2 are turned on and the third and four light emitting cells 44-3, 44-4 are turned off. In this case, current from the AC power source 10 does not flow through the third and fourth light emitting cells 44-3, 44-4 and the second on/off controller 42-2, but flows through the first, third and fourth on/off controllers 42-1, 42-3, 42-4 and the first and second light emitting cells 44-1, 44-2.

Figure 5C:
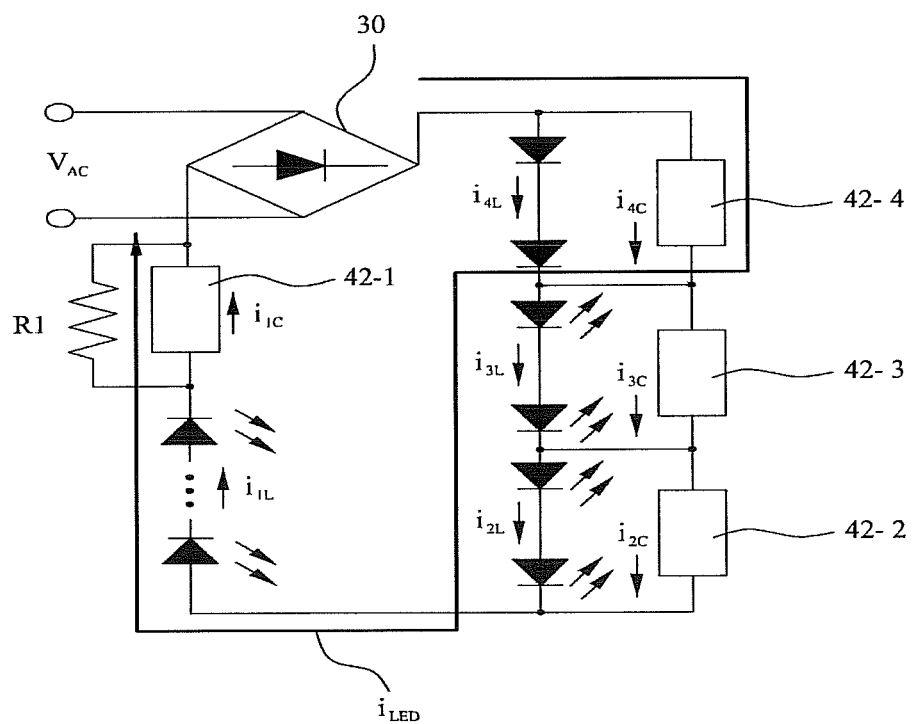

Thereafter, under the condition of t2≤t≤t3, as exemplarily shown in FIG. 5C, the first to third light emitting cells 44-1 to 44-3 are turned on and the four light emitting cell 44-4 is turned off. In this case, current from the AC power source 10 does not flow through the fourth light emitting cell 44-4 and the second and third on/off controllers 42-2, 42-3, but flows through the first and fourth on/off controllers 42-1, 42-4 and the first to third light emitting cells 44-1, 44-2, 44-3.

Figure 5D:
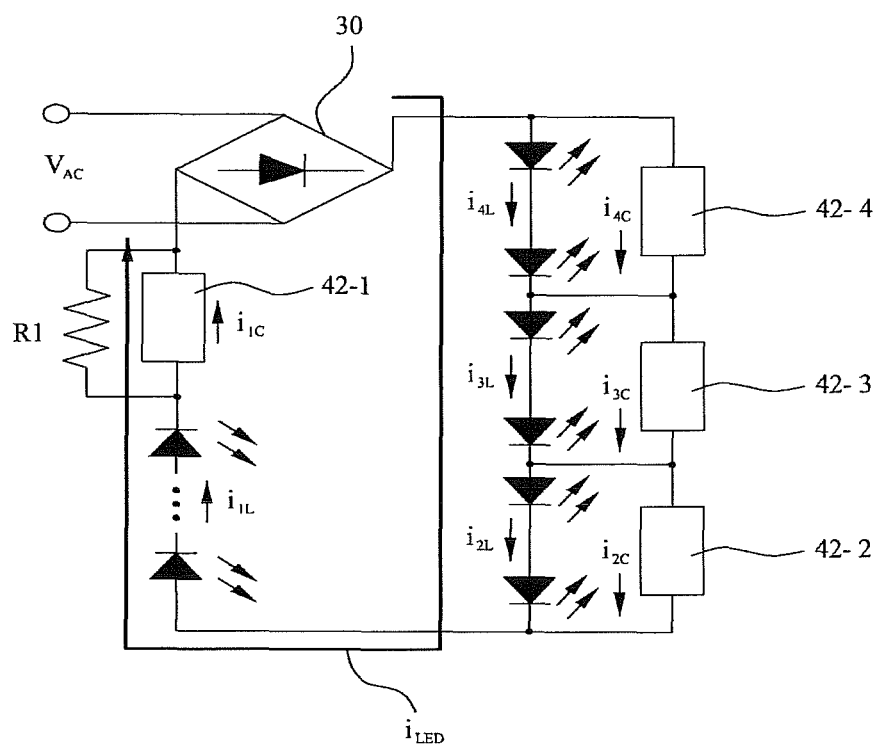

Thereafter, under the condition of t3≤t≤t4, as exemplarily shown in FIG. 5D, all of the first to fourth light emitting cells 44-1 to 44-4 are turned on. In this case, current from the AC power source 10 does not flow through the second to fourth on/off controllers 42-2 to 42-4, but flows through the first on/off controller 42-1 and the first to fourth light emitting cells 44-1 to 44-4.

Meanwhile, to protect the light emitting module from great variation in the level of the rectified external drive voltage, as exemplarily shown in FIG. 1, the current limit resistor R1 is additionally disposed. Referring to FIG. 4(*b*), it will be appreciated that the level of current iLED 80 under the presence of the current limit resistor R1 is greater than the level of current iLED 82 under the absence of the current limit resistor R1.

In the case of a conventional light emitting module, a drive IC to drive respective light emitting devices included in a light emitting device package is disposed outside the light emitting device package, rather than inside the package. On the other hand, in the case of the light emitting module according to the embodiment, as described above, the light emitting cells 44-1 to 44-4 and the on/off controllers 42-1 to 42-4 are disposed inside the respective light emitting device packages 40-1 to 40-4. Accordingly, it is possible to eliminate a space for installation of the on/off controllers 42-1 to 42-4 in the light emitting module and there is no limit on a space for a drive IC, thereby contributing to diversity in the design of the light emitting module.

In addition, in the case of the aforementioned conventional light emitting module, a single drive IC controls to turn all light emitting devices on or off. However, as described above, in the light emitting module according to the embodiment, a single on/off controller 42-*m* is provided at each light emitting cell 44-*m* in order to control to turn a single light emitting cell 44-*m* on or off. Accordingly, in the light emitting module according to the embodiment, it is unnecessary to design high withstand voltage of each on/off controller 42-*m* included in each light emitting device package 40-*m*. For example, if the number of the light emitting devices D included in each light emitting cell 44-*m* is 4, 80V is sufficient as a withstand voltage of the on/off controller 42-*m*. Such low withstand voltage may ensure reduced manufacturing costs, easier design, and enhanced circuit efficacy as compared to a high withstand voltage. For example, if a withstand voltage of the conventional drive IC is 600V and a withstand voltage of the on/off controller 42-*m* according to the embodiment is 80V, manufacturing costs may be reduced to 10% to 20% and circuit efficacy of the embodiment may be within a range of 88% to 90% higher than conventional circuit efficacy within a range of 80% to 85%.

In the light emitting module as exemplarily shown in FIG. 1, the respective light emitting device packages 40-1 to 40-M may be divided into various kinds based on light emission type, manufacturing method, and shape of board used.

Hereinafter, although the cases in which the above described light emitting device packages 40-1 to 40-M are implemented as a Chip On Board (COB) type and as a Package On Board (POB) type respectively have been described below, the embodiment is not limited thereto, and the light emitting device package may be implemented as any other shapes.

First, a light emitting device package 40-*m* in which each of the light emitting cells 44-1 to 44-M includes four light emitting devices D and a board is a COB type will be described.

Figure 6:
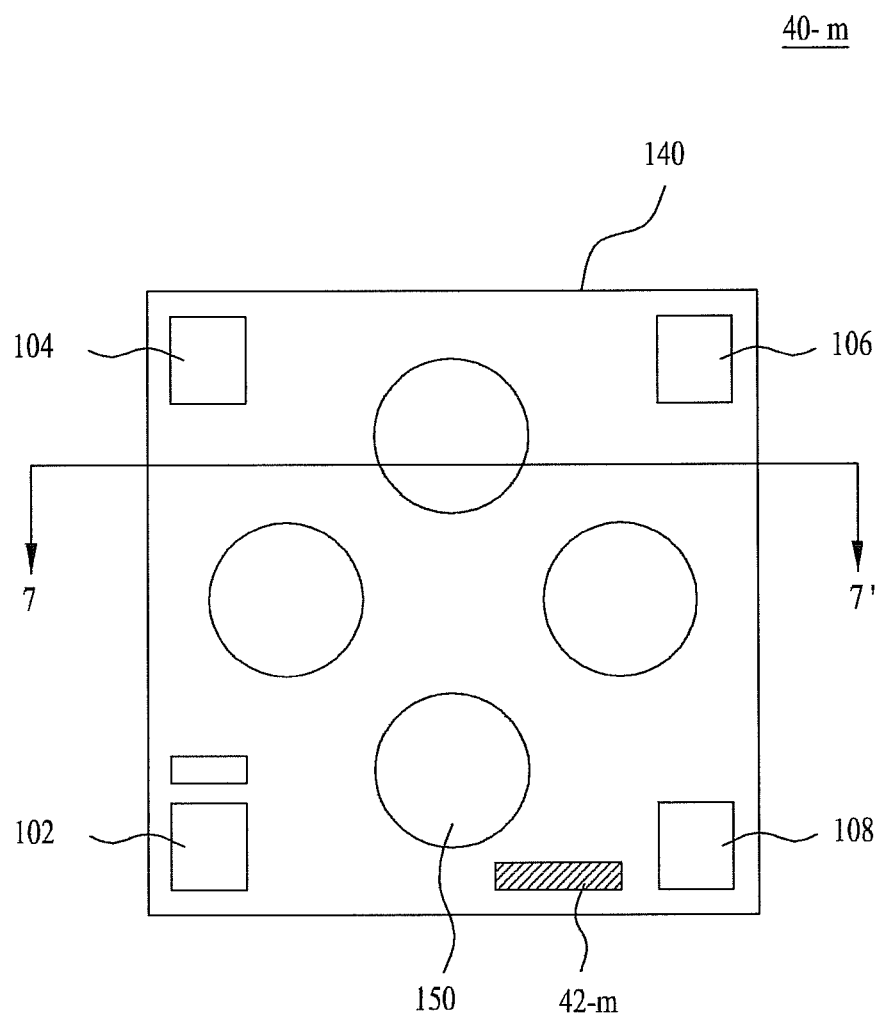
FIG. 6 is a plan view of a light emitting device package according to one embodiment.
Figure 7:
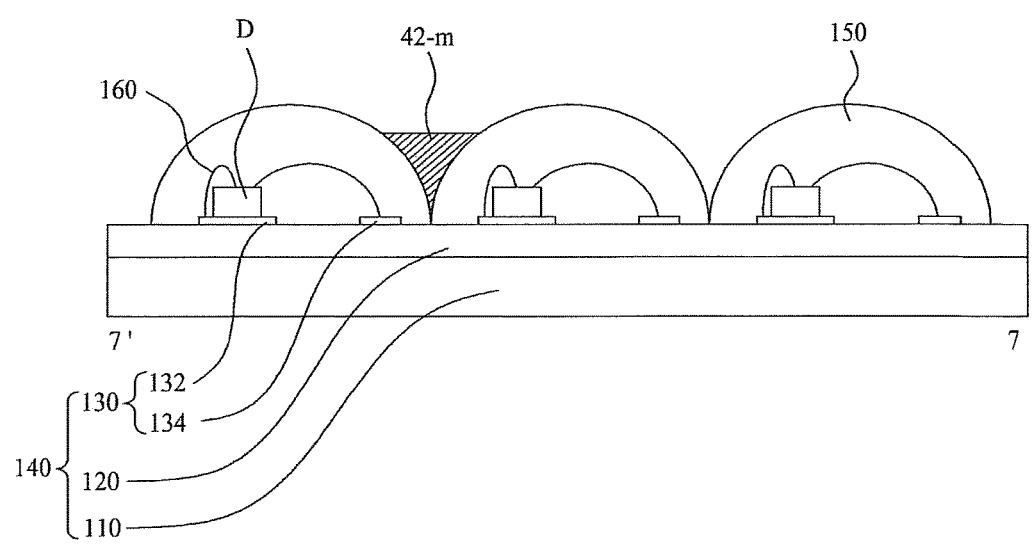
FIG. 7 is a sectional view taken along line 7-7' of FIG. 6.

FIG. 6 is a plan view of the light emitting device package 40-*m* according to one embodiment, and FIG. 7 is a sectional view taken along line 7-7' of FIG. 6.

Referring to FIGS. 6 and 7, the light emitting device package 40-*m* includes pads 102, 104, 106, 108, a board 140, molding members 150, wires 160, light emitting devices D, and an on/off controller 42-*m*.

Rectified external drive voltage output from the rectifier 30 is applied to the pads 102 to 108. That is, the pads 104 to 108 may be connected to the first terminal 42A as exemplarily shown in FIG. 2A and the pad 102 may be connected to the second terminal 42B.

The board 140 may include a circuit pattern printed on an insulator. Examples of the board 140 may include a Printed Circuit Board (PCB), a metal core PCB, a flexible PCB, a ceramic PCB, and the like.

For example, the board 140 may include a metal layer 110, an insulating layer 120, and a wiring layer 130. Each of the metal layer 110 and the wiring layer 130 may be formed of at least one or combinations of metals, such as silver (Ag) or aluminum (Al). The insulating layer 120 is disposed on the metal layer 110, and the wiring layer 130 is disposed on the insulating layer 120. The insulating layer 120 may be formed of a resin.

Although FIG. 7 illustrates each of the metal layer 110 and the insulating layer 120 as being a single layer, the embodiment is not limited thereto. That is, the metal layer 110 may include a plurality of layers, and the insulating layer 120 may include a plurality of layers.

The wiring layer 130 includes first and second wiring layers 132 and 134 electrically spaced apart from each other on the insulating layer 120. Each light emitting device D may be disposed on any one of the first and second wiring layers 132 and 134, and may be electrically connected to the first and second wiring layers 132 and 134 via wires 160. Although FIG. 7 illustrates the light emitting device D as being disposed on the first wiring layer 132 via an adhesive member (not shown), the embodiment is not limited thereto, and the light emitting device D may be disposed on the second wiring layer 134.

Each molding member 150 is disposed on the board 140 to cover the corresponding light emitting device D, in order to enclose and protect the light emitting device D. In this case, the on/off controller 42-*m* is not covered by the molding member 150. In addition, the molding member 150 may contain a fluorescent substance to change the wavelength of light emitted from the light emitting device D.

In the case of the aforementioned conventional light emitting module, a plurality of light emitting devices is disposed on a single board 140. On the other hand, in the light emitting module according to the embodiment, boards 140 of the respective light emitting device packages may be spaced apart from one another, or may be integrated with one another.

Next, a light emitting device package 40-*m* in which each light emitting cell 44-*m* includes three light emitting devices D and a board is a POB type will be described.

Figure 8:
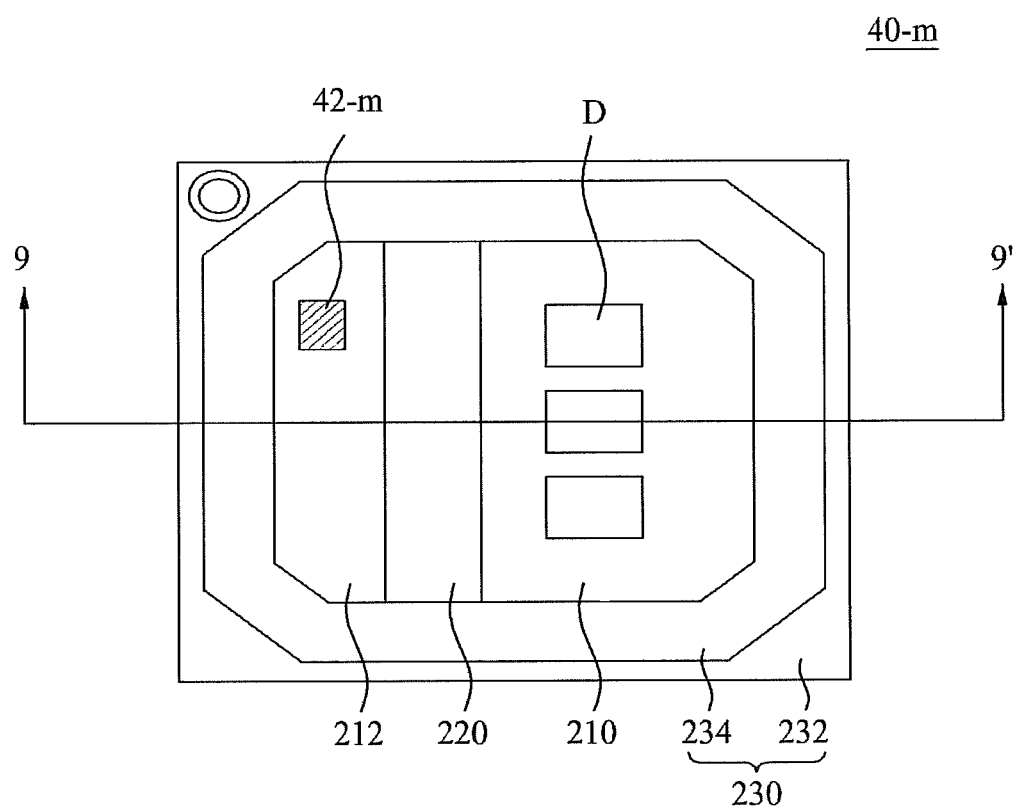
FIG. 8 is a plan view of a light emitting device package according to another embodiment.
Figure 9:
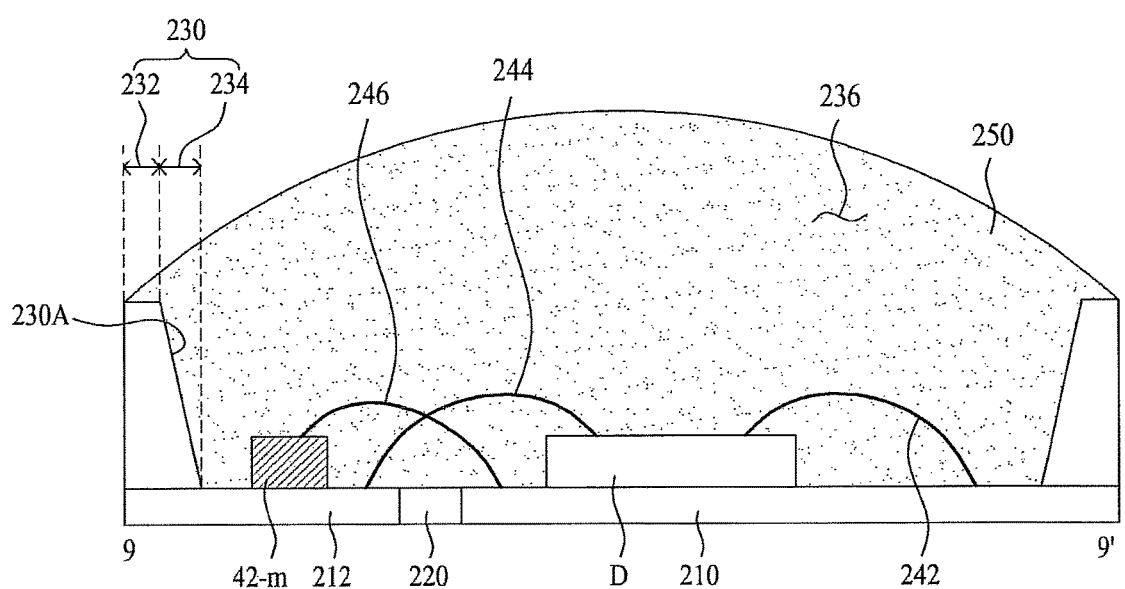
FIG. 9 is a sectional view taken along line 9-9' of FIG. 8.

FIG. 8 is a plan view of a light emitting device package 40-*m* according to another embodiment, and FIG. 9 is a sectional view taken along line 9-9' of FIG. 8.

Referring to FIGS. 8 and 9, the light emitting device package 40-*m* includes first and second lead frames 210, 212, an insulating layer 220, a housing 230, wires 242, 244, 246, a molding member 250, light emitting devices D, and the on/off controller 42-*m*.

First, the housing 230 is disposed on the first and second lead frames 210, 212 to define a cavity. The housing 230 includes first and second regions 232 and 234. The second region 234 extending from the first region 232 may be inclined. That is, the housing 230 may have an inclined inner surface 230A. The inclined inner surface 230A may facilitate upward reflection of light emitted from the light emitting devices D, thereby enhancing light extraction efficiency. The housing 230 may be formed via injection molding of a plastic resin, such as polyphthalamide (PPA). The housing 230 may be formed by insert injection molding a plastic resin in a state in which the first and second lead frames 210, 212 are located in a mold.

The first and second lead frames 210, 212 are electrically spaced apart from each other by the insulating layer 220. The first and second lead frames 210, 212 may serve not only enhance luminous efficacy by reflecting light emitted from the light emitting devices D, but also to outwardly dissipate heat generated in the light emitting devices D. The insulating layer 220 may be formed of $SiO_2$, $SiO_x$, $SiO_xN_y$, $Si_3N_4$, and $Al_2O_3$, but is not limited thereto.

The light emitting devices D are disposed on the first lead frame 210 in the cavity 236, and the on/off controller 42-$m$ is disposed on the second lead frame 212 in the cavity 236. Each light emitting device D is electrically connected to the first lead frame 210 via a wire 242, and is electrically connected to the second lead frame 212 via a wire 244. The on/off controller 42-$m$ may be electrically connected to the first lead frame 210 via a wire 246.

Each of the first and second lead frames 210, 212 may be formed of materials having excellent electrical conductivity and thermal conductivity. For example, the first and second lead frames 210, 212 may be formed of at least one or combinations of metals, such as silver (Ag) or aluminum (Al).

The molding member 250 is buried in the cavity 236 above the first and second lead frames 210, 212 to cover the light emitting devices D and the on/off controller 42-$m$, in order to enclose and protect the light emitting devices D and the on/off controller 42-$m$. In addition, the molding member 250 may contain a fluorescent substance to change the wavelength of light emitted from the light emitting devices D.

The molding member 150, 250 exemplarily shown in FIGS. 7 and 9 may be formed into a prescribed lens shape via molding using a mold, such as, for example, transfer molding. Alternatively, referring to FIG. 9, the molding member 250 may be formed by injecting light transmitting resin into the cavity 236.

Meanwhile, the on/off controller 42-$m$ as exemplarily shown in FIGS. 6 to 9 serves to prevent electrostatic discharge of the light emitting devices D due to static electricity introduced from an external source. That is, the on/off controller 42-$m$ may serve as Zener diodes. Hence, the light emitting module according to the embodiment does not require separate Zener diodes. Accordingly, omission of the expensive Zener diodes may simplify a manufacturing process and reduce manufacturing costs.

In addition, the on/off controller 42-$m$ may be disposed at a position where conventional Zener diodes have typically been installed. In this case, it is unnecessary to provide an additional region for installation of the on/off controller 42-$m$ within the light emitting device package 40-$m$.

Meanwhile, although FIGS. 7 and 9 illustrate the light emitting devices D of a horizontal type, the embodiment is not limited thereto. That is, the light emitting devices D may be of a vertical type or a flip chip bonding type.

Figure 10:
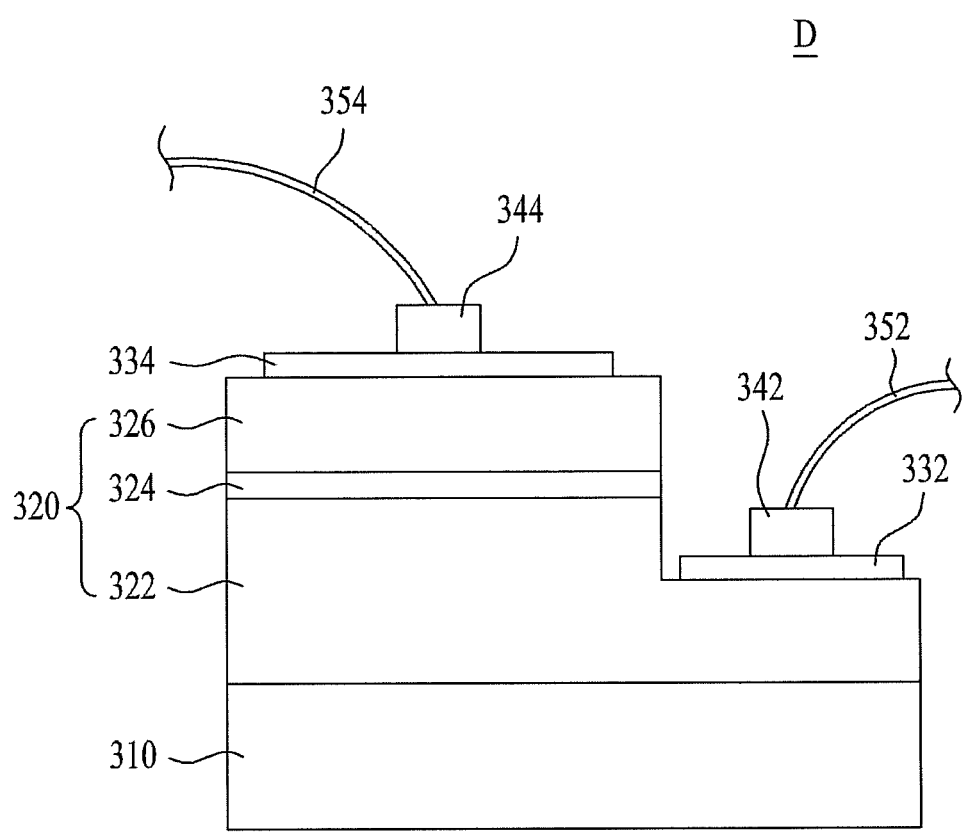
FIG. 10 is a sectional view of a light emitting device shown in FIGS. 7 and 9.

FIG. 10 is a sectional view of the light emitting device D shown in FIGS. 7 and 9.

The light emitting device D, exemplarily shown in FIG. 10, includes a substrate 310, a light emitting structure 320, first and second ohmic contact layers 332, 334, and first and second electrodes 342, 344.

The substrate 310 may be formed of a conductive material or non-conductive material. For example, the substrate 310 may be formed of at least one of $Al_2O_3$, GaN, SiC, ZnO, GaP, InP, $Ga_2O_3$, GaAs, or Si.

A buffer layer (not shown) may be further interposed between the substrate 310 and the light emitting structure 320 to alleviate lattice mismatch. The buffer layer may, for example, be formed of at least one material selected from the group consisting of Al, In, N, and Ga, but is not limited thereto. In addition, the buffer layer may have a single layer or multi-layer form.

The light emitting structure 320 includes a first conductive semiconductor layer 322, an active layer 324, and a second conductive semiconductor layer 326, which are sequentially stacked one above another over the substrate 310.

The first conductive semiconductor layer 322 may be formed of a group III-V or II-VI compound semiconductor doped with a first conductive dopant. If the first conductive semiconductor layer 322 is an n-type semiconductor layer, the first conductive dopant may include Si, Ge, Sn, Se, and Te as an n-type dopant, but is not limited thereto.

For example, the first conductive semiconductor layer 322 may be formed of a semiconductor material having a composition of $In_xAl_yGa_{(1-x-y)}N$ ($0 \leq x \leq 1$, $0 \leq y \leq 1$, $0 \leq x+y \leq 1$). The first conductive semiconductor layer 322 may be formed of at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 324 is a layer in which electrons (or holes) injected through the first conductive semiconductor layer 322 and holes (or electrons) injected through the second conductive semiconductor layer 326 meet each other to emit light having energy determined by an inherent energy band of a constituent material of the active layer 324.

The active layer 324 may be at least one of a single well structure, a multi-well structure, a single quantum well structure, a multi quantum well structure, a quantum wire structure, or a quantum dot structure.

A well layer and a barrier layer of the active layer 324 have a pair structure of any one or more of InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having a lower band gap energy than a band gap energy of the barrier layer.

A conductive clad layer (not shown) may be formed above and/or below the active layer 324. The conductive clad layer may be formed of a semiconductor having a higher band gap energy than a band gap energy of the barrier layer of the active layer 324. For example, the conductive clad layer may contain GaN, AlGaN, InAlGaN, or a super lattice structure thereof. In addition, the conductive clad layer may be doped with an n-type or p-type dopant.

The second conductive semiconductor layer 326 may be formed of a semiconductor compound, such as a group III-V or II-VI compound semiconductor. For example, the second conductive semiconductor layer 326 may be formed of a semiconductor material having a composition of $In_xAl_yGa_{1-x-y}N$ ($0 \leq x \leq 1$, $0 \leq y \leq 1$, $0 \leq x+y \leq 1$). The second conductive semiconductor layer 326 may be doped with a second conductive dopant. If the second conductive semiconductor layer 326 is a p-type semiconductor layer, the second conductive dopant may include Mg, Zn, Ca, Sr, Ba, etc as a p-type dopant.

The first conductive semiconductor layer 322 may be an n-type semiconductor layer and the second conductive semiconductor layer 326 may be a p-type semiconductor layer. Alternatively, the first conductive semiconductor layer 322 may be a p-type semiconductor layer and the second conductive semiconductor layer 326 may be an n-type semiconductor layer. In addition, a semiconductor layer including an n-type or p-type semiconductor layer may be further disposed below the second conductive semiconductor layer 326. Thereby, the light emitting structure 320 may have any one structure among an N-P junction structure, a P-N junction structure, an N-P-N junction structure, and a P-N-P junction structure.

Meanwhile, the first ohmic contact layer 332 serves to improve ohmic characteristics of the first conductive semiconductor layer 322. For example, the first ohmic contact layer 332 may include at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO as well as Ag, Ni, Cr, Ti, Al, Rh, Pd, Ir, Sn, In, Ru, Mg, Zn, Pt, Au, or Hf, but is not limited to the aforementioned materials.

The second ohmic contact layer 334 serves to improve ohmic characteristics of the second conductive semiconductor layer 326. If the second conductive semiconductor layer 326 is a p-type semiconductor layer, the second conductive semiconductor layer 326 may have a high contact resistance due to a low impurity doping concentration thereof, thus having poor ohmic characteristics. The second ohmic contact layer 334 may serve to improve the above described ohmic characteristics. The second ohmic contact layer 334 may include at least one of In, Zn, Sn, Al, Ga, Sb, N, Ir, Ag, Ni, Cr, Ti, Rh, Pd, Ru, Mg, Pt, Au, or Hf and oxygen. Alternatively, the second ohmic contact layer 334 may include at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO as well as Ag, Ni, Cr, Ti, Al, Rh, Pd, Ir, Sn, In, Ru, Mg, Zn, Pt, Au, or Hf, but is not limited to the aforementioned materials.

The first electrode 342 is disposed on the first ohmic contact layer 332, and the second electrode 344 is disposed on the second ohmic contact layer 334. For example, the first and second electrodes 342 and 344 may be formed of at least one of aluminum (Al), titanium (Ti), chrome (Cr), nickel (Ni), copper (Cu), or gold (Au), and may have a single layer or multi-layer structure.

The first electrode 342 may be connected to the first wiring layer 132 exemplarily shown in FIG. 7 via a wire 352, and the second electrode 344 may be connected to the second wiring layer 134 via a wire 354. In this case, the wires 352 and 354 correspond to the wires 160 exemplarily shown in FIG. 7.

Alternatively, the first electrode 342 may be connected to the first lead frame 210 exemplarily shown in FIG. 9 via the wire 352, and may be connected to the second lead frame 212 via the wire 354. In this case, the wires 352 and 354 respectively correspond to the wires 242 and 244 exemplarily shown in FIG. 9.

Figure 11:
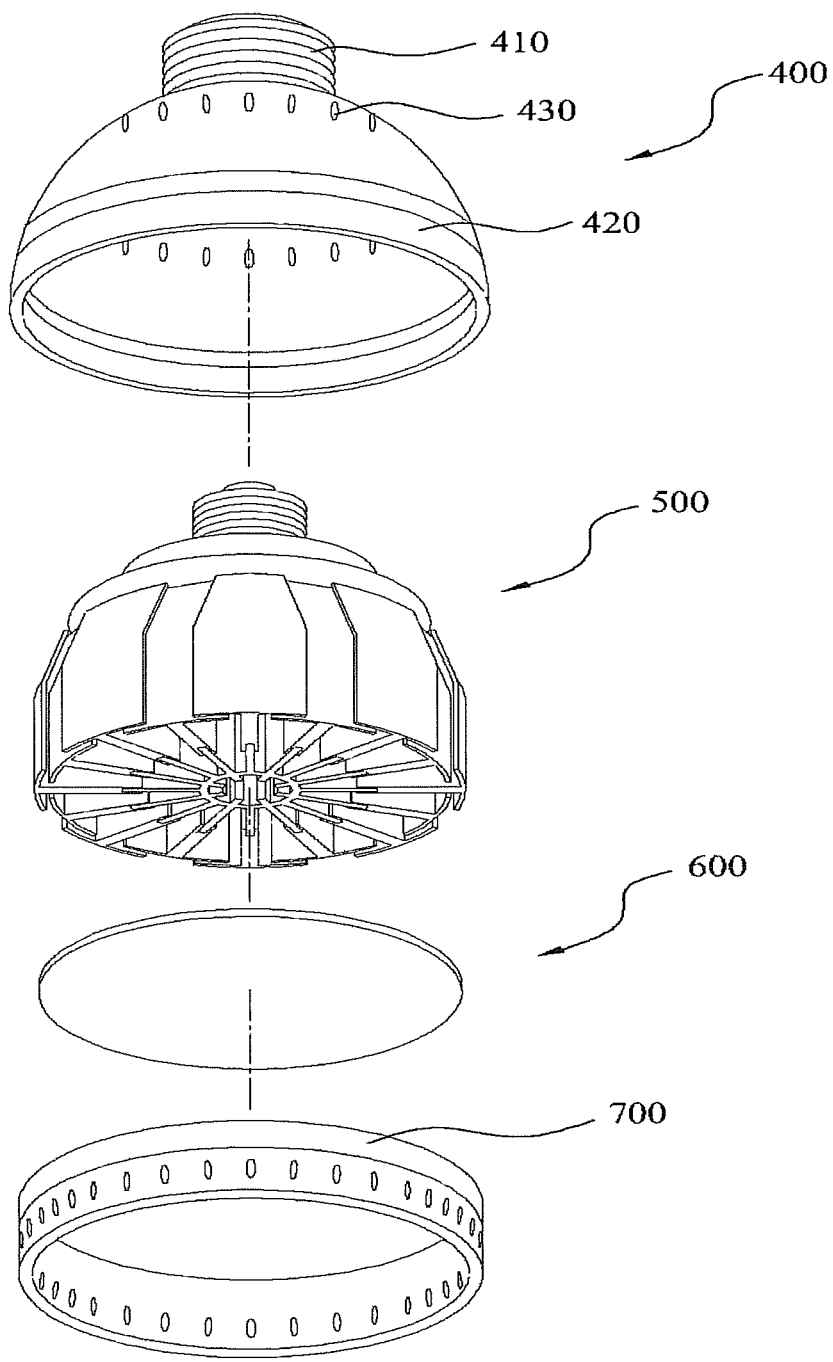
FIG. 11 is an exploded perspective view showing one embodiment of a lighting apparatus including a light emitting module.

FIG. 11 is an exploded perspective view showing one embodiment of a lighting apparatus including a light emitting module.

The lighting apparatus according to one embodiment includes a light emitting module 600 to emit light, a housing 400 in which the light emitting module 600 is disposed, a radiator 500 to radiate heat of the light emitting module 600, and a holder 700 to couple the light emitting module 600 and the radiator 500 to the housing 400.

The housing 400 includes a socket coupling portion 410 coupled to an electric socket (not shown), and a body portion 420 connected to the socket coupling portion 410, the light emitting module 600 being mounted inside the body portion 420. The body portion 420 may have an air flow hole 430 perforated therein.

In the embodiment, the body portion 420 of the housing 400 may have a plurality of air flow holes 430 having a radial arrangement. That is, a single air flow hole or a plurality of air flow holes having various other arrangements except for the shown radial arrangement may be provided as needed.

The light emitting module 600 may include a light emitting device package and a controller, and may correspond to the light emitting module as exemplarily shown in FIG. 1. The light emitting module 600 may be shaped to be inserted into an opening of the housing 400, and may be formed of a material having high thermal conductivity in order to transfer heat to the radiator 500 as will be described hereinafter.

The holder 700 may be located below the light emitting module 600 and may include a frame and air flow holes. In addition, although not shown, an optical member may be provided below the light emitting module 600 to diffuse, scatter, or converge light emitted from the light emitting module 600.

Figure 12:
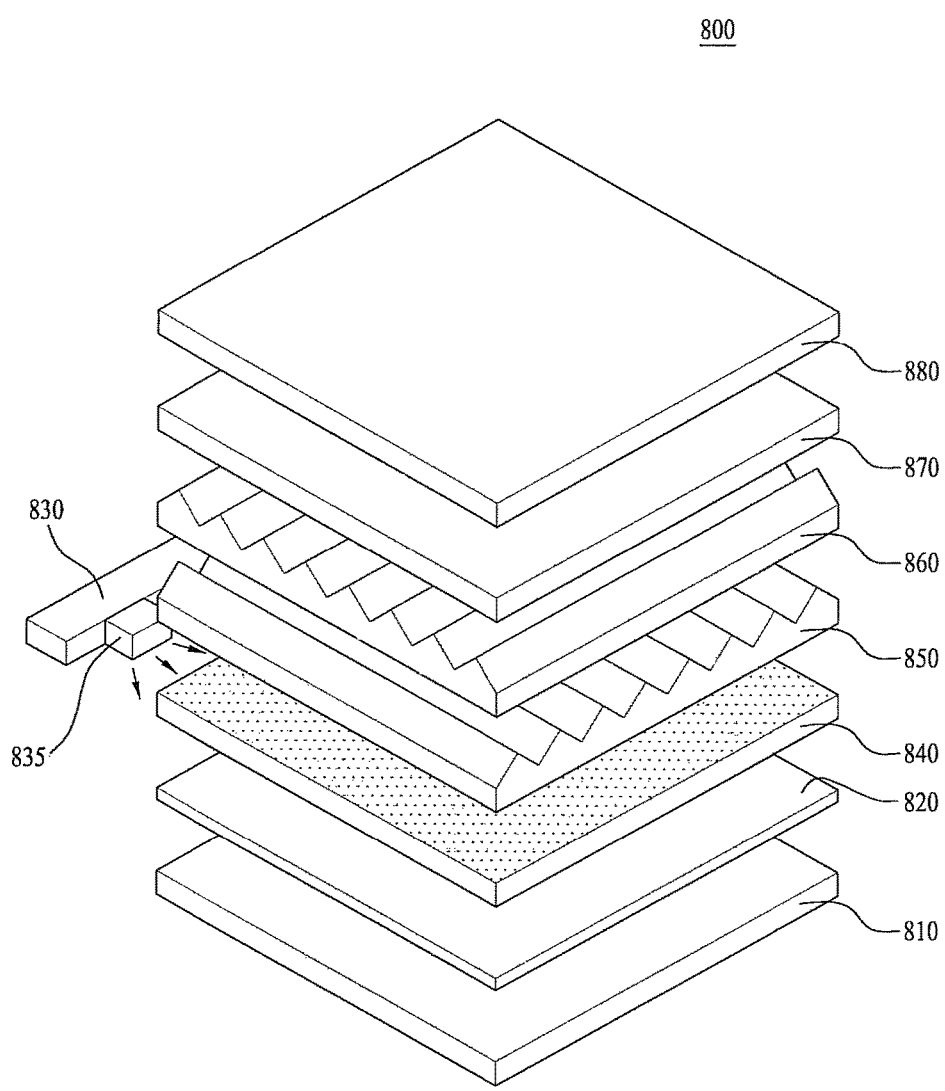
FIG. 12 is an exploded perspective view showing one embodiment of a display apparatus including a light emitting module.

FIG. 12 is an exploded perspective view showing one embodiment of a display apparatus 800 including a light emitting module.

Referring to FIG. 12, the display apparatus 800 according to one embodiment includes a light emitting module 830, 850, a reflector 820 on a bottom cover 810, a light guide plate 840 disposed in front of the reflector 820 to guide light emitted from the light emitting module 830, 850 forward of the display apparatus 800, a first prism sheet 850 and a second prism sheet 860 disposed in front of the light guide plate 840, a panel 870 disposed in front of the second prism sheet 860, and a color filter 880 disposed in front of the panel 870.

The light emitting module may include a light emitting device 835 disposed on a circuit board 830 and may correspond to the light emitting module of FIG. 1.

The bottom cover 810 may be configured to receive constituent elements of the display apparatus 800. The reflector 820 may be a separate element as exemplarily shown in the drawing, or may be a high reflectivity material coated on a rear surface of the light guide plate 840 or a front surface of the bottom cover 810.

Here, the reflector 820 may be formed of a material which has high reflectivity and may be formed into an ultra thin shape. For example, the reflector 820 may be formed of polyethyleneterephthalate (PET).

The light guide plate 840 serves to scatter light emitted from the light emitting module to allow the light to be uniformly distributed throughout a screen of the display apparatus 800. Accordingly, the light guide plate 840 is formed of a material having good refractivity and transmissivity, and may be formed of polymethylmethacrylate (PMMA), polycarbonate (PC), or polyethylene (PE). Alternatively, the light guide plate 840 may be omitted to transmit light in a space above the reflector 820 in an air guide manner.

The first prism sheet 850 includes a support film and a light-transmitting elastic polymer material formed on one surface of the support film. The polymer material may form a prism layer in which a plurality of 3-dimensional patterns is repeated. Here, the plurality of patterns may be stripe patterns consisting of ridges and valleys repeatedly formed as shown.

The direction of ridges and valleys formed on one surface of the support film of the second prism sheet 860 may be perpendicular to the direction of the ridges and valleys formed on one surface of the support film of the first prism sheet 850. This allows light transmitted from the light emitting module and the reflector to be uniformly distributed throughout the panel 870.

In the present embodiment, the first prism sheet 850 and the second prism sheet 860 serve as optical sheets. As examples of other combinations of optical sheets, a micro-lens array, a combination of a diffusive sheet and a micro-lens array, or a combination of a single prism sheet and a micro-lens array may be provided.

The panel 870 may be a liquid crystal display panel, or may be other kinds of display devices requiring a light source.

The panel 870 includes liquid crystals interposed between glass bodies, and a polarizer is disposed on either glass body for utilization of polarity of light. Here, the liquid crystals have intermediate properties between liquid and solid, are organic molecules having fluidity like a liquid, and have the state where the liquid crystals are regularly disposed as a crystal. Thus, the panel 870 displays an image using properties of liquid crystals in which a regular molecular arrangement is changed by an external electric field.

The liquid crystal display panel used in the display apparatus is an active matrix type and employs a transistor as a switch to regulate voltage to be supplied to each pixel.

The color filter 880 may be disposed on a front surface of the panel 870 to transmit only red, green, and blue light on a per pixel basis among the light emitted from the panel 870, thereby enabling display of an image.

As is apparent from the above description, differently from the conventional light emitting module in which a drive IC, which corresponds to an on/off controller to drive each light emitting device of a light emitting device package, is disposed outside the light emitting device package rather than inside the package, the light emitting module according to one embodiment is configured such that both a light emitting cell and an on/off controller are disposed inside a single light emitting device package. Accordingly, it is possible to eliminate a space for installation of the on/off controller from the light emitting module, which may contribute to diversity in the design of the light emitting module. Further, differently from the conventional light emitting module in which a single drive IC controls to turn all light emitting devices on or off, in the light emitting module according to one embodiment, on/off controllers are disposed on a per light emitting cell basis such that a single on/off controller controls to turn a single light emitting cell on or off. Accordingly, it is unnecessary to design a high withstand voltage of each on/off controller, which may result in reduced manufacturing costs, easy design, and enhanced circuit efficacy. Furthermore, differently from the conventional light emitting module requiring separate Zener diodes, in the light emitting module according to one embodiment, the on/off controllers serve as Zener diodes. Thus, expensive Zener diodes are no longer required, which results in a simplified manufacturing process and reduced manufacturing costs. Moreover, since the on/off controllers are disposed at positions of existing Zener diodes, it is unnecessary to provide a separate space for the on/off controllers within the light emitting device package.

Embodiments provide a light emitting module in which both at least one light emitting device and an on/off controller are disposed together in a unit light emitting device package.

In one embodiment, a light emitting module includes a plurality of light emitting device packages sequentially turned on or off according to the level of external drive voltage and connected to one another in series, wherein each of the plurality of light emitting device packages includes a light emitting cell having at least one light emitting device, and an on/off controller configured to control to turn the light emitting cell on or off.

In each of the plurality of light emitting device packages, the on/off controller may include a current control integrated Circuit (IC) configured to control flow of current to the light emitting cell.

In at least one light emitting device package among the plurality of light emitting device packages, the light emitting cell may be connected to the on/off controller in parallel. In any one light emitting device package among the plurality of light emitting device packages, the light emitting cell and the on/off controller may be connected to each other in series.

The any one light emitting device package may further include a current limit resistor connected to the on/off controller in parallel.

The light emitting module may further include a rectifier configured to rectify the external drive voltage of an alternating current type and to supply the rectified external drive voltage to the plurality of light emitting device packages.

The light emitting module may further include a fuse disposed between a supply source of the alternating current type external drive voltage and the rectifier.

Each of the plurality of light emitting device packages may be a Package On Board (POB) type. Each of the plurality of light emitting device packages may include first and second lead frames electrically spaced apart from each other, a housing disposed on the first and second lead frames to define a cavity, and a molding member buried in the cavity to cover the light emitting device and the on/off controller, and the light emitting device may be disposed on the first lead frame within the cavity, and the on/off controller is disposed on the second lead frame within the cavity.

An inner surface of the housing defining the cavity may be inclined.

Each of the plurality of light emitting device packages may be a Chip On Board (COB) type. Each of the plurality of light emitting device packages may include a board, and a molding member disposed to cover the light emitting device disposed on the board.

The board may include a metal layer, an insulating layer disposed on the metal layer, and a wiring layer disposed on the insulating layer and electrically connected to the light emitting device.

The boards included respectively in the plurality of light emitting device packages may be integrated with one another, or may be spaced apart from one another.

The number of the light emitting cells of the plurality of light emitting device packages to be turned on may increase as the level of the external drive voltage increases.

In another embodiment, a light emitting module includes first to Mth light emitting cells connected to one another in series (here, M is a positive integer of 2 or more), and first to Mth on/off controllers controlling to turn each of the first to Mth light emitting cells on or off and connected to one another in series, wherein the first to Mth on/off controllers sequentially turn the first to Mth light emitting cells on or off according to a level of external drive voltage, and wherein each of the first to Mth on/off controllers and a corresponding one of the first to Mth light emitting cells are disposed in a unit light emitting device package.

The first to Mth on/off controllers may control flow of current to the respective first to Mth light emitting cells according to the level of the external drive voltage.

At least one light emitting cell among the first to Mth light emitting cells may be connected to at least one corresponding on/off controller among the first to Mth on/off controllers in parallel.

One light emitting cell among the first to Mth light emitting cells may be connected to the corresponding on/off controller among the first to Mth on/off controllers in series.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising a plurality of light emitting device packages configured to be sequentially turned on or off according to the level of external drive voltage and connected to one another in series, wherein each of the plurality of light emitting device packages includes:
   a light emitting cell having at least one light emitting device; and
   an on/off controller configured to control to turn the light emitting cell on or off, wherein each of the plurality of light emitting device packages is a Package On Board (POB) type, wherein each of the plurality of light emitting device packages comprises:
   first and second lead frames configured to be electrically spaced apart from each other;
   a housing disposed on the first and second lead frames to define a cavity; and
   a molding member buried in the cavity to cover the light emitting device and the on/off controller, and wherein the light emitting device is disposed on the first lead frame within the cavity, and the on/off controller is disposed on the second lead frame within the cavity.

2. The module according to claim 1, wherein, in each of the plurality of light emitting device packages, the on/off controller includes a current control Integrated Circuit (IC) configured to control flow of current to the light emitting cell.

3. The module according to claim 1, wherein, in at least one light emitting device package among the plurality of light emitting device packages, the light emitting cell is connected to the on/off controller in parallel.

4. The module according to claim 1, wherein, in any one light emitting device package among the plurality of light emitting device packages, the light emitting cell and the on/off controller are connected to each other in series.

5. The module according to claim 4, wherein the any one light emitting device package further includes a current limit resistor connected to the on/off controller in parallel.

6. The module according to claim 1, further comprising a rectifier configured to rectify the external drive voltage of an alternating current type and to supply the rectified external drive voltage to the plurality of light emitting device packages.

7. The module according to claim 6, further comprising a fuse disposed between a supply source of the alternating current type external drive voltage and the rectifier.

8. The module according to claim 1, wherein an inner surface of the housing defining the cavity is inclined.

9. The module according to claim 1, wherein the boards included respectively in the plurality of light emitting device packages are integrated with one another.

10. The module according to claim 1, wherein the boards included respectively in the plurality of light emitting device packages are spaced apart from one another.

11. The module according to claim 1, wherein the number of the light emitting cells of the plurality of light emitting device packages to be turned on increases as the level of the external drive voltage increases.

12. A light emitting module comprising a plurality of light emitting device packages configured to be sequentially turned on or off according to the level of external drive voltage and connected to one another in series, wherein each of the plurality of light emitting device packages includes:
   a light emitting cell having at least one light emitting device; and
   an on/off controller configured to control to turn the light emitting cell on or off.

13. The module according to claim 12, wherein, in each of the plurality of Light emitting device packages, the on/off controller includes a current control Integrated Circuit (IC) configured to control flow of current to the light emitting cell.

14. The module according to claim 12, wherein, in at least one light emitting device package among the plurality of light emitting device packages, the light emitting cell is connected to the on/off controller in parallel.

15. The module according to claim 12, wherein, in any one light emitting device package among the plurality of light emitting device packages, the light emitting cell and the on/off controller are connected to each other in series.

16. The module according to claim 15, wherein the any one light emitting device package further includes a current limit resistor connected to the on/off controller in parallel.

* * * * *